United States Patent
Lee

(10) Patent No.: US 6,741,117 B2
(45) Date of Patent: May 25, 2004

(54) ANTIFUSE CIRCUIT

(75) Inventor: Kang-Youl Lee, Kyoungki-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/331,292

(22) Filed: Dec. 30, 2002

(65) Prior Publication Data

US 2003/0218493 A1 Nov. 27, 2003

(30) Foreign Application Priority Data

May 27, 2002 (KR) ........................................ 2002-29181

(51) Int. Cl.[7] .............................................. H01H 37/76
(52) U.S. Cl. ...................................................... 327/525
(58) Field of Search ................................ 327/524, 525, 327/526

(56) References Cited

U.S. PATENT DOCUMENTS

| | | | | |
|---|---|---|---|---|
| 5,397,939 A | 3/1995 | Gordon et al. | | 326/38 |
| 5,471,154 A | 11/1995 | Gordon et al. | | 326/38 |
| 5,488,187 A | 1/1996 | Mason | | 568/932 |
| 5,631,862 A | 5/1997 | Cutter et al. | | 365/96 |
| 5,706,238 A | 1/1998 | Cutter et al. | | 365/225.7 |
| 5,801,574 A | 9/1998 | Martin et al. | | 327/525 |
| 5,847,441 A | 12/1998 | Cutter et al. | | 257/530 |
| 5,917,763 A | 6/1999 | Mullarky | | 365/200 |
| 5,956,282 A | 9/1999 | Casper | | 365/225.7 |
| 6,087,890 A | * | 7/2000 | Kim | 327/526 |
| 6,115,283 A | | 9/2000 | Hidaka | 365/149 |
| 6,150,868 A | * | 11/2000 | Kim et al. | 327/525 |
| 6,285,603 B1 | | 9/2001 | Ku et al. | 365/200 |
| 6,333,666 B2 | * | 12/2001 | Kim et al. | 327/525 |
| 6,400,208 B1 | * | 6/2002 | Lesher et al. | 327/525 |
| 6,456,546 B2 | * | 9/2002 | Kim et al. | 365/200 |
| 6,477,094 B2 | * | 11/2002 | Kim et al. | 365/200 |

FOREIGN PATENT DOCUMENTS

| | | |
|---|---|---|
| JP | 09-127201 | 5/1997 |
| JP | 2001-210094 | 8/2001 |

* cited by examiner

*Primary Examiner*—Jeffrey Zweizig
(74) *Attorney, Agent, or Firm*—Marshall, Gerstein & Borun LLP

(57) ABSTRACT

An antifuse circuit serves to generate an antifuse enable signal for use in repairing a defected memory cell in a semiconductor device. The inventive antifuse includes: an antifuse unit employing an antifuse, wherein the antifuse is controlled as being shorted or insulated according to a repair program; an antifuse precharge unit for precharging the antifuse by using a predetermined voltage level in response to a power-up signal, wherein the predetermined voltage level is lower than that of an external voltage source; and an output latch unit driven by the predetermined voltage level for latching a antifuse voltage level appearing on the antifuse and generating the antifuse enable signal corresponding to the antifuse voltage level.

16 Claims, 7 Drawing Sheets

ANTIFUSE CIRCUIT

TECHNICAL FIELD

An antifuse circuit for use in a semiconductor memory device is disclosed which can be used as a replacement for a defective memory cell thereby making the cell operable in a more stable manner.

DESCRIPTION OF RELATED ART

Advances in semiconductor fabrication techniques and in a memory design have led to the commercial production of semiconductor memories, which hold millions of bits of information. It is important that a manufacturer verify that each and every bit or memory cell on a semiconductor memory chip is addressable before the chip is sold.

However, due to the large number of bits or memory cells on each chip, it is unrealistic to assume that chips can be fabricated with every bit or memory cell position functioning. Physical defects in the manufacturing process tend to make it very difficult to manufacture devices of such a high bit density without one or more bits or memory cells becoming defective.

Although a manufacturer cannot sell a semiconductor memory chip without ensuring that the full range of addresses is functional, discarding memory chips having defective bits is wasteful, inefficient and costly. Thus, it is desirable to provide an approach, which allows fabrication of a memory chip with redundant bits or cells to compensate for the inevitable bit or memory cell defects.

Designers have incorporated one or more redundant rows or columns into memory devices to provide a method of patching bit or memory cell errors in memory chips. That is, redundant cells are provided which can be accessed when testing indicates the existence of bit or memory cell defects in the memory device. If, for example, a bit or a memory cell in a first column of a memory array is found to be defective, the entire first column is typically replaced by using a substitute column. The patch or replacement is accomplished using a bank of polysilicon fuses. The address of the patched or replaced column is burned into the fuse bank using techniques known in the art. Thus, whenever the address of the defective column is presented to the semiconductor memory, the replacement column will be accessed instead. This solution reduces the number of wasted memory chips, which would otherwise be unusable due to defective bits or memory cells.

However, the above procedure of patching the defected semiconductor memory cell needs to be performed before packaging the memory device. After packaging, the fuse could not be broken or blown out by using a laser beam of a conventional technique. That is, using such a conventional fuse bank, it could not repair the defected semiconductor device after packaging the semiconductor memory device. Therefore, in order to overcome the above problem after packing, an antifuse circuit is further introduced in a semiconductor memory device.

FIG. 1 is a schematic block diagram illustrating a conventional antifuse circuit employing an antifuse.

As shown, the conventional antifuse circuit includes an antifuse block 10, a power-up signal generator 20, a high-voltage generator 30 and a redundancy circuit 40.

The antifuse circuit 10 receives a program-mode selection signal PGM and an address signal ADDR to generate an antifuse enable signal ANT_EN. The power-up signal generator 20 outputs a power-up signal VEXT_DET representing a stabilization of a power provided in the semiconductor device after the power is supplied to the semiconductor device. The high-voltage generator 30 supplies a high-voltage to the antifuse block 10 in order to program the antifuse block 10. The redundancy circuit 40 servers to perform the replacement operation for a defective memory cell in response to the antifuse enable signal ANTI_EN from the antifuse block 10.

FIG. 2 is a circuit diagram of the conventional antifuse block 10 shown in FIG. 1.

As shown, the antifuse block 10 includes an antifuse unit 11 for controlling the antifuse being short-circuited or insulated in response to the program mode selection signal PGM and the address signal ADDR. The antifuse block 10 also includes an antifuse precharge unit 12 for precharging the antifuse unit 11 according to a power-up signal.

The antifuse unit 11 includes a NAND gate ND1, a PMOS transistor MP1, two NMOS transistors MN1 and MN2, an antifuse ANT_FUSE and two invertors I1 and I2.

The output port of the NAND gate ND1 is connected to a gate of the PMOS transistor MP1 and a gate of NMOS transistor MN2 and receives two signals PGM and ADDR. The PMOS transistor MP1 is coupled to an external voltage source of a first voltage level Vext between the NMOS transistor MN2. The NMOS transistor MN2 is coupled to another NMOS transistor MN1 in serial. A gate of the MN1 is coupled to the PGM and the NMOS transistor MN1 is coupled to a ground of a second voltage level Vss. The antifuse ANTI_FUSE is coupled to a common node N1 of the MP1 and MN2. The antifuse ANTI_FUSE receives a high voltage signal VBB_ANTI generated from the high-voltage generator 30. The invertors I1 and I2 are coupled to the common node N1 in order to generate the antifuse enable signal ANTI_EN. The invertors I1 and I2 employ an internal voltage source of a third voltage level Vint as an operation voltage and output the antifuse enable signal ANTI_EN corresponding a fourth voltage level of the node N1 to the redundancy circuit 40 by latching the fourth voltage level of the node N1.

The antifuse precharge unit 12 includes an inverter 13 and a PMOS transistor MP2. The inverter 13 serves to invert the power-up signal VEXT_DET. The PMOS transistor MP2 receives an inverted power-up signal from the inverter 13 to thereby selectively couple the first voltage level Vext to the node N1.

FIG. 3 is a timing diagram for explaining an operation of the antifuse block shown in FIG. 2.

Hereinafter, a conventional antifuse circuit by employing the antifuse is explained in detail as referring to the FIGS. 1 to 3.

The high-voltage generator 30 outputs a voltage signal of a fifth voltage level VBB_ANTI. The fifth voltage level VBB_ANTI can vary according to the operational mode. It becomes a low-voltage level (less than, e.g., −3V) in a program mode and becomes, e.g., 0V as like as a ground voltage level Vss in a normal mode.

In the program mode, when the PGM of a high voltage level and the ADDR of a high voltage level are inputted to the antifuse unit 11, the ND1's output becomes a low voltage level. The MP1 becomes turned on and MN2 becomes turned off. Therefore, the fourth voltage level of the node N1 is increased to the first voltage level Vext, e.g., +3.3V and the fifth voltage level VBB_ABTI of, e.g., −3V is applied to another terminal of the antifuse ANTI_FUSE. As a result, an insulation material or layer of the antifuse becomes broken and the antifuse ANTI_FUSE is then short-circuited as demonstrated in a "short circuit state" A1 of FIG. 3.

On the other hand, in the program mode, if the PGM is inputted as a high voltage level signal and the ADDR is inputted as a low voltage level signal, then an output of the ND1 becomes a high voltage level. Therefore, the NMOS transistors MN1 and MN2 become turned on and the node N1 become a low voltage level. As a result, a voltage between 0V and −3V is applied both ends of the antifuse ANTI_FUSE and the insulation material or layer of the antifuse is unbroken to thereby maintain the initial insulation as depicted in an "insulation state A2" of FIG. 3

When the antifuse ANTI_FUSE is programmed as the short circuit A1 of FIG. 3, at the initial state, an external voltage source of the first voltage level Vext is applied to a semiconductor and a power-up signal VEXT_DET is inputted to the antifuse precharge unit 12. The voltage level of the power-up signal VEXT_DET is increased according to the first voltage level Vext and it becomes a low voltage level when the first voltage level Vext becomes stable.

On the other hand, the program mode selection signal PGM is a low voltage level and an output of NAND gate ND1 then become a high voltage level. The PMOS transistor MP1 and NMOS transistor MN1 is turned off and other NMOS transistor MN2 is turned on. The antifuse short-circuited is coupled to the fifth voltage level VBB_ANTI, which is identical to the second voltage Vss.

Therefore, a voltage level of the node N1 is changed according to the power-up signal VEXT_DET. When the power-up signal VEXT_DET becomes low, an internal voltage source of the third voltage level Vint is generated. If the third voltage level Vint is applied to the inverters I1 and I2 and then the output signal ANTI_EN of the antifuse unit 11 have the same voltage level of the internal power voltage Vint.

Another initial operation of the semiconductor device is explained in detail when the antifuse is programmed as the insulation state A2 of FIG. 3.

At the initial state, the first voltage level Vext is applied to the semiconductor device and the power-up signal VEXT_DET of a high voltage level is then inputted to the antifuse precharge unit 12. The program mode selection signal PGM is a low voltage level and an output of NAND gate ND1 becomes a high voltage level. The PMOS transistor MP1 and NMOS transistor MN1 is turned off and other NMOS transistor MN2 is turned on.

Thereafter, as shown in FIG. 3, the voltage level of the node N1 is varied according to the power-up signal VEXT_DET. If the power-up signal VEXT_DET becomes a low voltage level, the voltage level of node N1 maintains as a floating state until the third voltage level Vint is applied to the inverters I1 and I2 since the antifuse maintains the insulating state.

As described in a time period T1 of FIG. 3, the voltage level of the floated node N1 becomes very unstable according to other factors of the semiconductor device to thereby affect on the antifuse enable signal ANT_EN. Therefore, there may be a potential problem that the unstable antifuse signal causes errors in the control of the antifuse as depicted in FIG. 3.

Furthermore, as described above, the external voltage level Vext is directly applied to an end of the antifuse at initial mode in accordance with the power-up signal VEXT_DET. A capacitor structure used as an antifuse is produced at the same manufacture process for producing a capacitor for memory cell. The reliability of the capacitor can be guarantied when applying a voltage identical to or lower than the internal voltage level Vint. However, if the external voltage is applied directly to the capacitor, the reliability of the capacitor cannot be guarantied. That is, if the external power voltage is applied to the antifuse made by using the capacitor structure, there is high possibility for the antifuse to be short-circuited even though there is no defective memory cell in the semiconductor device.

SUMMARY OF THE DISCLOSURE

Therefore, an antifuse circuit is disclosed for effectively increasing the reliability of an antifuse circuit of a semiconductor device.

In one embodiment, an antifuse circuit for generating an antifuse enable signal for use in repairing a defected memory cell of a semiconductor device comprises: an antifuse unit employing an antifuse, wherein the antifuse is controlled as being shorted or insulated according to a repair program; an antifuse precharge unit for precharging the antifuse by using a predetermined voltage level in response to a power-up signal, wherein the predetermined voltage level is lower than that of an external voltage source; and an output latch unit driven by the predetermined voltage level for latching a antifuse voltage level appearing on the antifuse and generating the antifuse enable signal corresponding to the antifuse voltage level.

In another embodiment, an antifuse circuit comprises: an antifuse unit employing an antifuse, wherein the antifuse is controlled as a short-circuited state or a an insulation state according to a repair program; a program unit for programming one of the short-circuited and the insulation state of the antifuse in response to a program mode selection signal and an address signal; an antifuse precharge unit for precharging the antifuse by using a predetermined voltage level in response to a power-up signal, wherein the predetermined voltage level is lower than that of an external voltage source; and an output latch unit driven by the predetermined voltage level for latching a antifuse voltage level appearing on the antifuse and generating the antifuse enable signal corresponding to the antifuse voltage level.

BRIEF DESCRIPTION OF THE DRAWINGS

The above and other features of the disclosed antifuse circuit will become apparent from the following description of the preferred embodiments given in conjunction with the accompanying drawings, wherein.

DETAILED DESCRIPTION OF THE PRESENTLY PREFERRED EMBODIMENTS

Other aspects of the disclosed circuits will become apparent from the following description with reference to the accompanying drawings.

Figure 1:
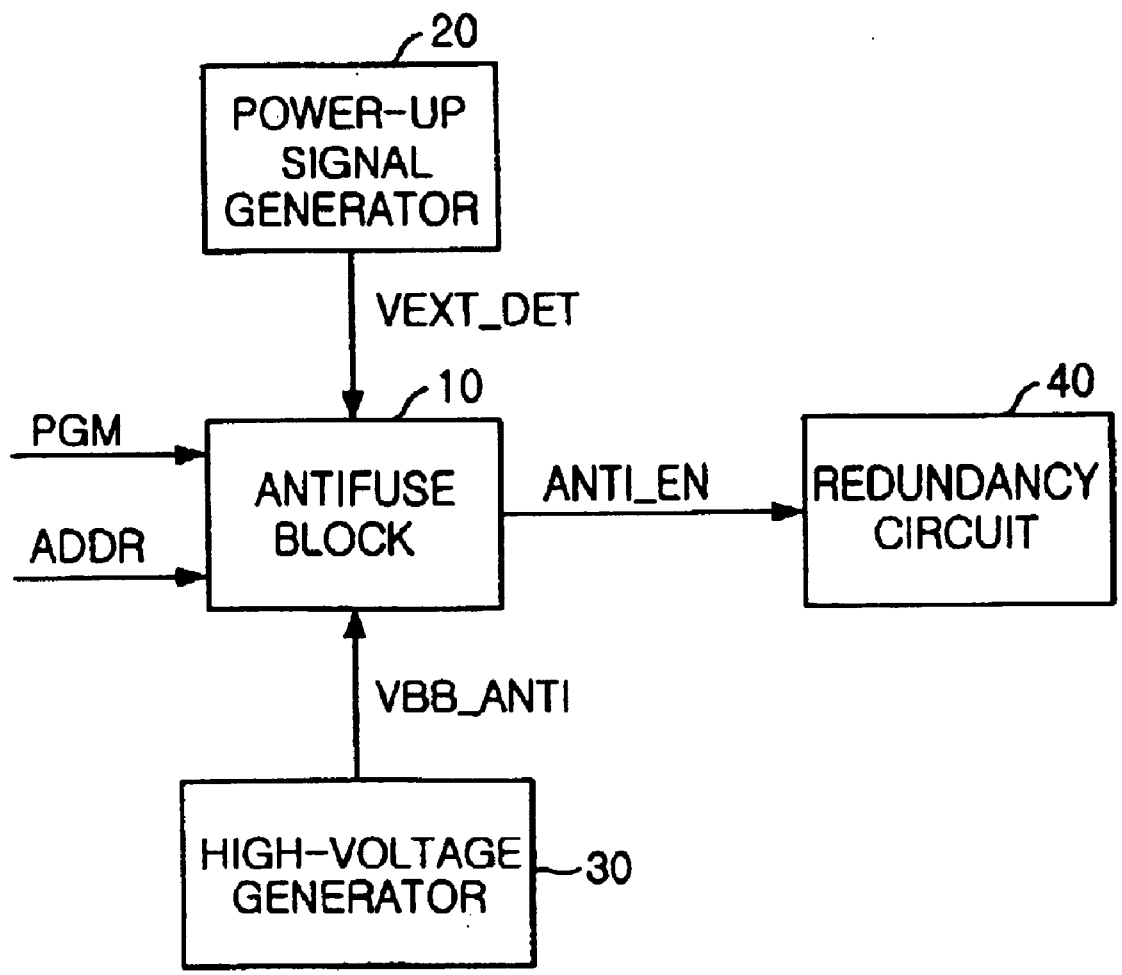
FIG. 1 is a schematic block diagram illustrating a conventional antifuse circuit employing a capacitor type antifuse.
Figure 2:
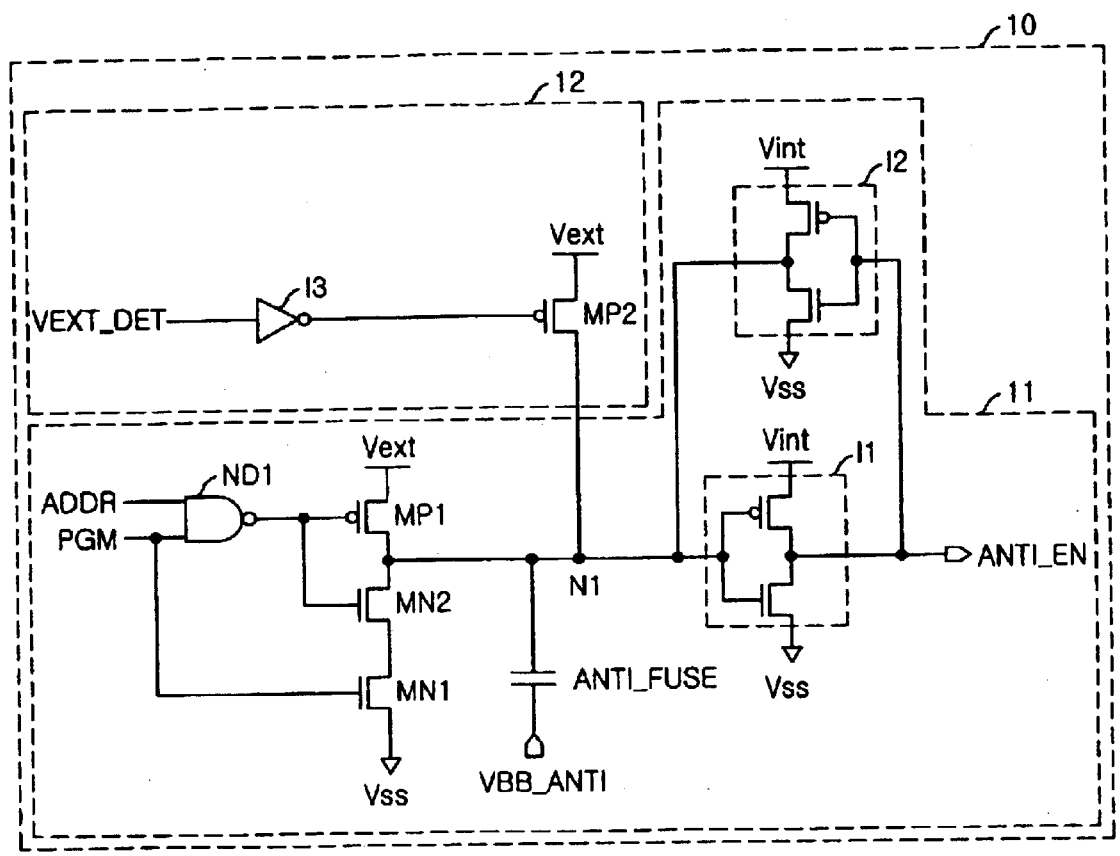
FIG. 2 is a circuit diagram showing the conventional antifuse block 10 described in FIG. 1.
Figure 3:
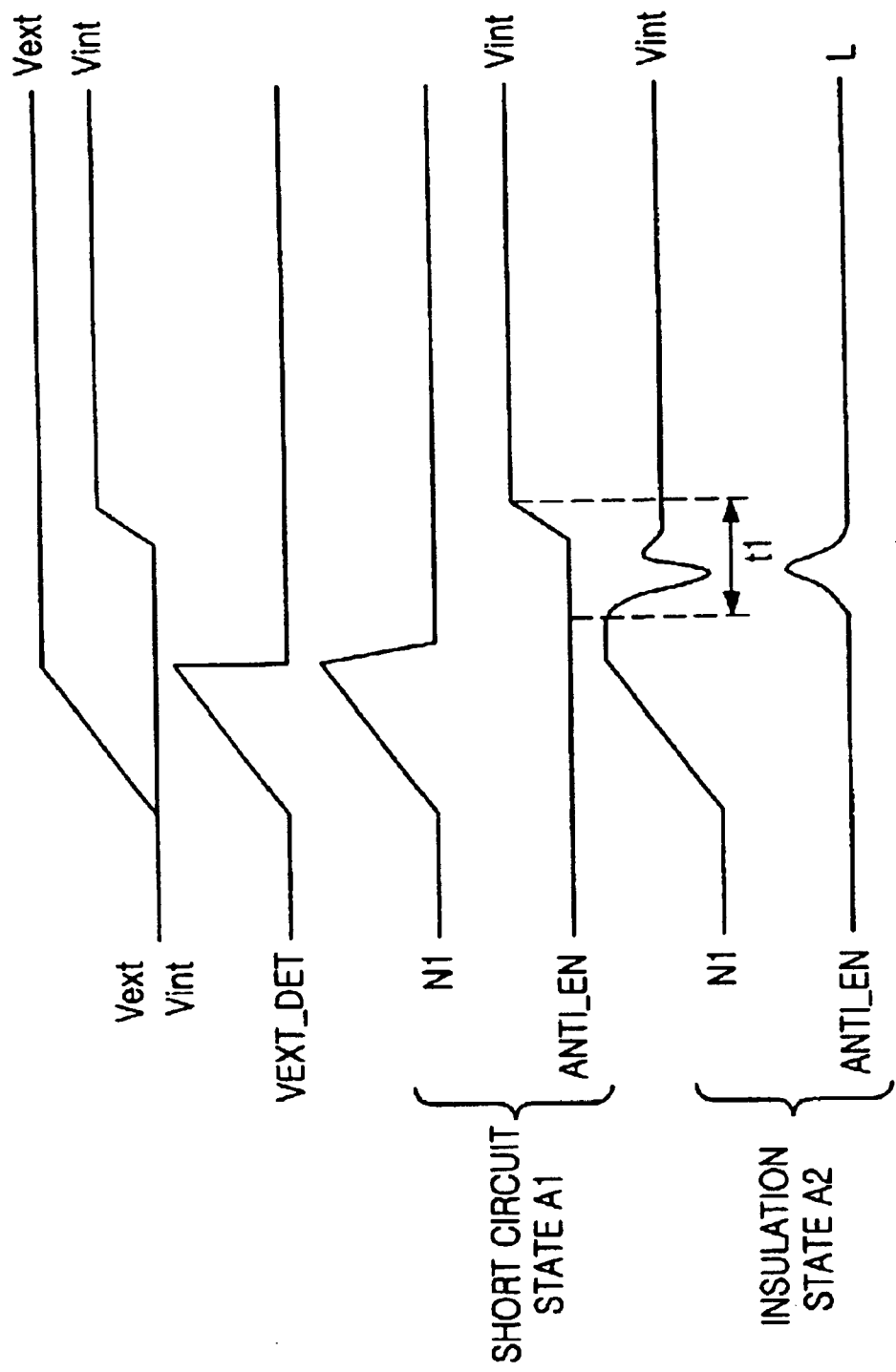
FIG. 3 is a timing diagram for explaining an operation of the antifuse unit depicted in FIG. 2.
Figure 4:
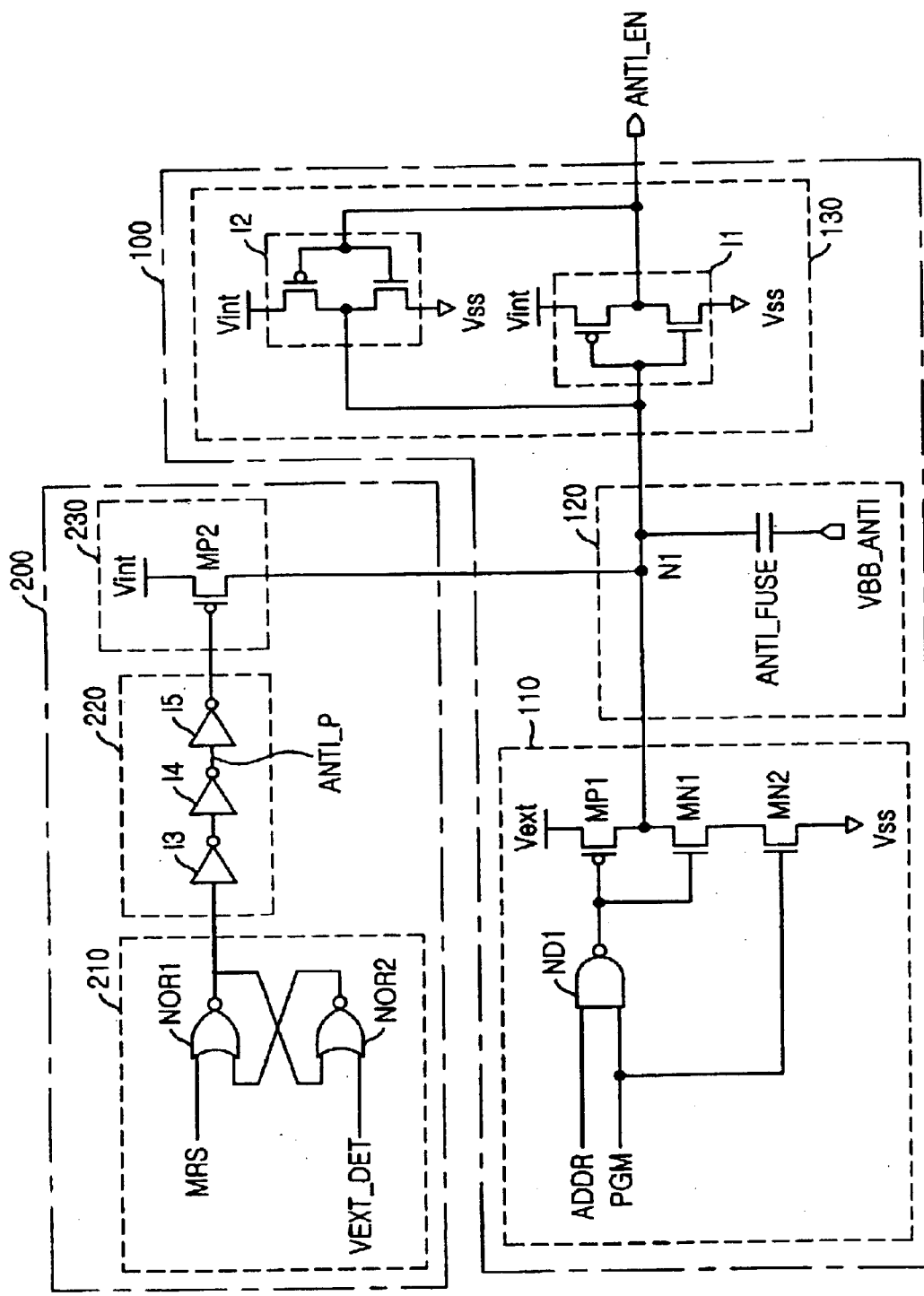
FIG. 4 is a circuit diagram representing an antifuse block in accordance with one disclosed embodiment.

FIG. 4 is a circuit diagram showing an antifuse block in accordance with one disclosed embodiment.

As shown, the antifuse block includes an antifuse unit 100 has an antifuse ANT_FUSE, wherein the antifuse ANTI_FUSE becomes short-circuited or insulated according to a repair program, and an antifuse precharge unit 200 for latching a power-up signal VEXT_DET generated when an external voltage Vext is applied to the semiconductor device and precharging a node N1 of the antifuse as much as an internal power voltage Vint according to a latched signal.

An antifuse unit 100 includes a program unit 110, an antifuse 120 and an output latch unit 130. The program unit 110 controls the antifuse 120 by receiving two signals, a program mode selection signal PGM and an address signal ADDR. The programming unit 110 is coupled to the antifuse 120. The antifuse ANTI_FUZE is also coupled to a node N1 and a high-voltage VBB_ANTI. The output latch unit 130 latches a voltage level developed on the node N1 and generate an antifuse enable signal ANTI_EN corresponding thereto.

The programming unit 110 includes a NAND gate ND1, a PMOS transistor MP1, a first NMOS transistor MN1 and a second NMOS transistor MN2. The NAND gate ND1 receives the program mode selection signal PGM and the address signal ADDR. An output of the NAND gate ND1 is coupled to a gate of the PMOS transistor MP1. The PMOS transistor MP1 is also coupled between an external voltage source of a first voltage level Vext and a node N1 of the antifuse 120. The output of the NAND gate ND1 is also couple to a gate of the first NMOS transistor MN1. The first NMOS transistor MN1 is also coupled to the node N1 of the antifuse 120. Another terminal of the first NMOS transistor MN1 is coupled to the second NMOS transistor MN2. A gate of the second NMOS transistor MN2 receives the program mode selection signal PGM and another terminal of the second NMOS transistor MN2 is coupled to a ground of a second voltage level Vss and the first NMOS transistor MN1.

The output latch unit 130 includes a first inverter I1 and second inverter I2. The first inverter I1 is provided with an internal voltage source of third voltage level Vint as an operation voltage and its output is coupled to the node N1. The second inverter I2 has an input terminal coupled to the node N1 and has an output terminal to an input of the inverter I1 and the output of the antifuse block 100.

The antifuse precharge unit 200 includes an input latch unit 210, a pull-up transistor 230 and an inverter chain 220 connected therebetween. The input latch unit 210 latches a power-up signal VEXT_DET and selectively outputs the power-up signal VEXT_DET according to a mode register set signal MRS. The pull-up transistor 230 passes a third voltage level Vint of an internal voltage source to the node N1 according to an output of the input latch unit 210. The inverter chain 220 is coupled between the output of the input latch unit 210 and the pull-up transistor 230.

The mode register set signal MRS is an initialization signal inputted before a read/write operation of the semiconductor device.

The input latch unit 210 includes a first NOR gate NOR1 and a second NOR gate NOR2. The first NOR gate receives the mode register set signal MRS and an output of the second NOR gate NOR2. The second NOR gate receives the power-up signal VEXT_DET and an output of the first NOR gate NOR1.

Figure 5:
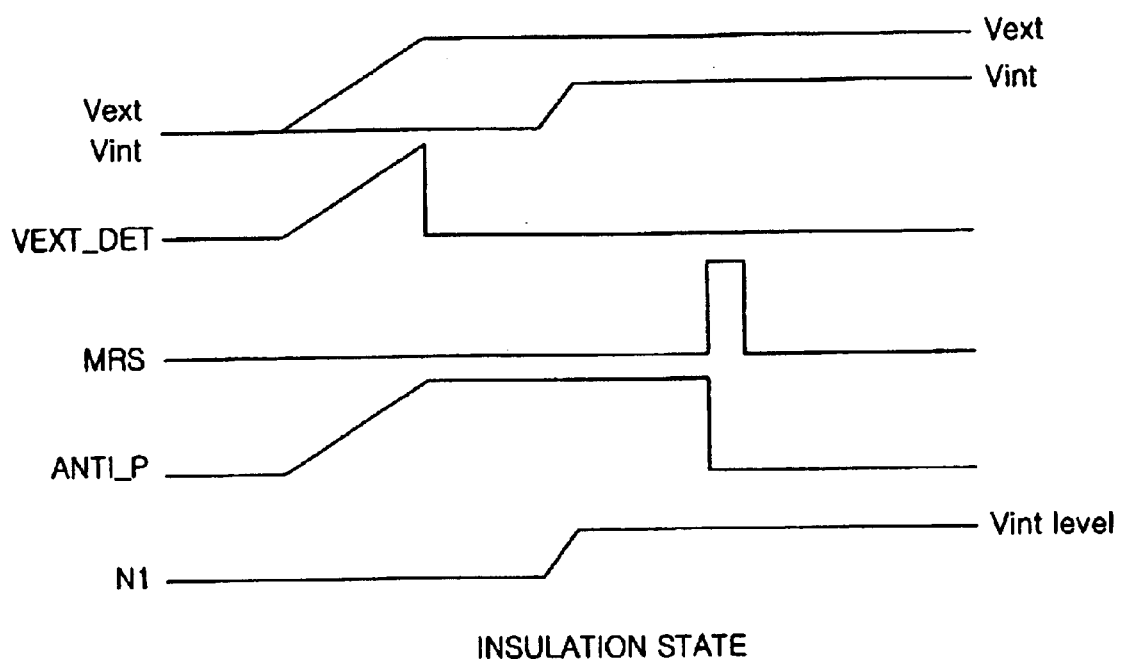
FIG. 5 is a timing diagram for explaining an initial operation of a semiconductor device when the antifuse in the antifuse unit shown in FIG. 4 is operated in an insulation state.

FIG. 5 is a timing diagram representing an initial operation of the antifuse block 200 shown in FIG. 4 when the antifuse has an insulation state.

As shown, the first voltage level Vext is applied to the semiconductor device. And then a power-up signal VEXT_DET is supplied to the antifuse precharge unit 200 and the mode register set signal MRS is maintained as a low voltage level. Therefore, an output voltage level of the input latch unit 210 is increased, wherein the output voltage level is correspondent to an output ANTI_P of the inverter I4, and then the PMOS transistor MP2 becomes turned on by the inverter chain 220.

The third voltage level Vint is generated as an operational voltage level of the semiconductor device after receiving of the external power voltage Vext and the third voltage level Vint is coupled through the PMOS transistor MP2 to the node N1 and another third voltage level Vint is then coupled through the inverter I2 to the node N1. Thereafter, the mode register set signal MRS becomes a high voltage level and the output ANT_P becomes a low voltage level. In this case, the third voltage level Vint provided through the PMOS transistor MP2 is not provided on the node N1 but the third voltage level from the inverter I2 is still coupled to the node N2. Therefore, the voltage level of the node N1 does not become floated when the antifuse is not broken, and, furthermore, the insulation state can be safely maintained.

The internal voltage source of the third voltage level Vint is used as a voltage source for precharging the node N1 of the antifuse. That is, the third voltage level is selectively coupled through the pull-up transistor 230 to the node N1. However, another voltage source having a voltage level slightly lower than the first voltage level Vext can be also used as the voltage for precharging the node N1.

Consequently, the reliability of a program can be increased since a level of the external power voltage Vext is not directly applied to the node N1 during the node N1 of the antifuse is precharged.

Moreover, the node N1 never become floated in the insulation state since the third voltage level is sequentially coupled to node N1 through the PMOS transistor MP2 and the inverter I2 and then the third voltage level from the PMOS transistor MP2 is only disconnected in response to the mode register set signal MRS.

In a meantime, the MRS is generally generated before a write/read operation, the antifuse circuit of the present invention can have a sufficient time for precharging the antifuse.

Figure 6:
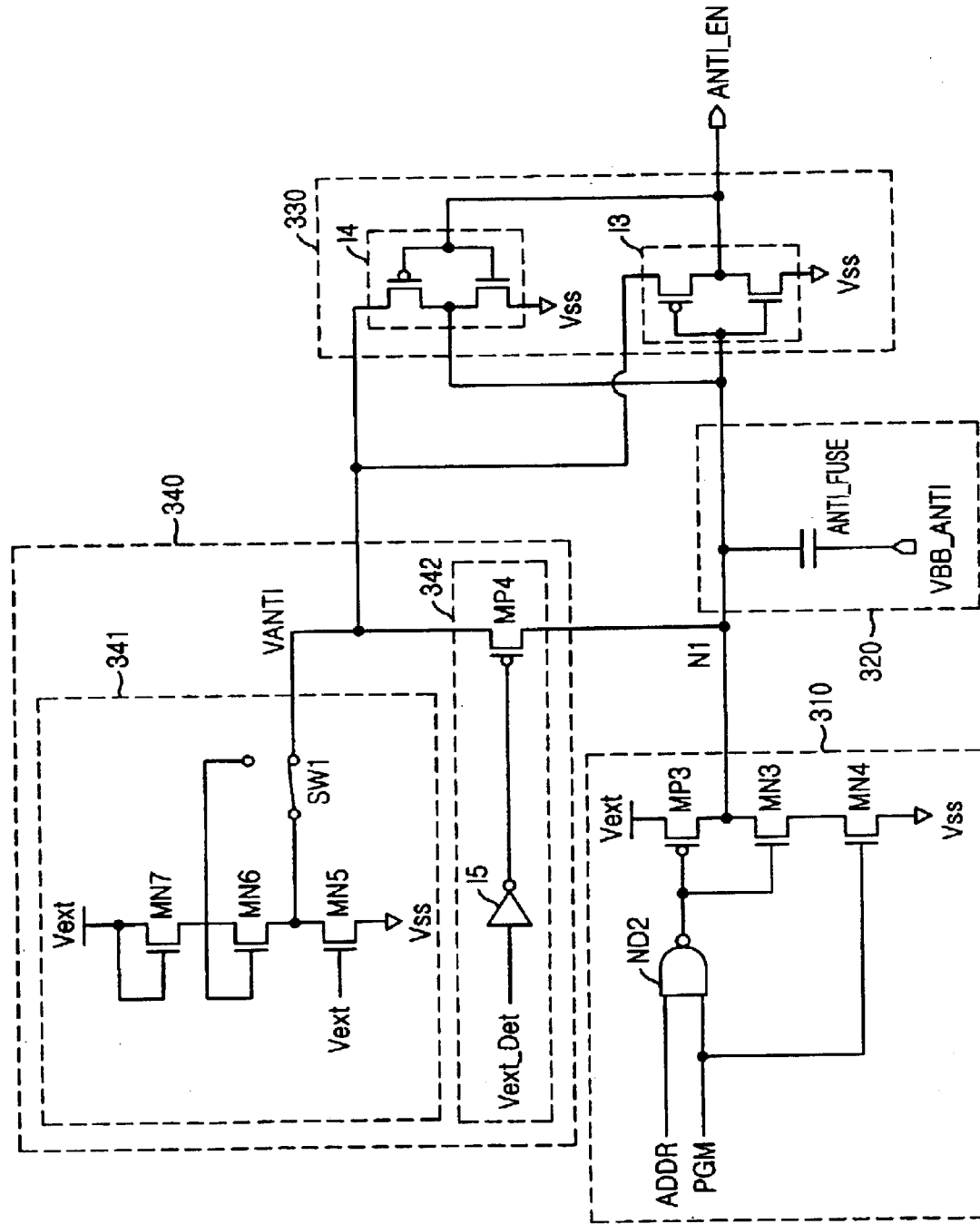
FIG. 6 is a circuit diagram depicting an antifuse block in accordance with another disclosed embodiment.

FIG. 6 is a circuit diagram showing an antifuse block in accordance with another embodiment. For the sake of convenience, like elements of FIG. 4 is represented by using like numerals.

As shown, the antifuse circuit includes an antifuse 320, a program unit 310, an antifuse precharge unit 340 and an output latch unit 330. The antifuse 320 is coupled to the program unit 310. The program unit 310 programs the antifuse 320 being short-circuited or insulated. The antifuse precharge unit 340 precharges a node N1 of the antifuse according to a power-up signal VEXT_DET. The output latch unit 330 latches and outputs a voltage level of the node N1 of the antifuse by using a decreased voltage level from a standard voltage generator 341 as an operation voltage.

The antifuse precharge unit 340 includes the standard voltage generator 341 for decreasing the first voltage level Vext of the external voltage source to a predetermined voltage level and outputting the predetermined voltage level. The antifuse precharge unit 340 also includes a switch unit 342 for determining the predetermined voltage level VANTI.

The standard voltage generator 341 has diode-type NMOS transistors MN7 and MN6 coupled to the external voltage source of the first voltage level Vext in serial and a long-channel NMOS transistor MN5 connects the MN6 and the ground of the second voltage level Vss. A switch SW1 selectively coupled an output of the standard voltage generator 341 as the predetermined voltage level VANTI to the switch unit 342, which can be determined by user or a presetting procedure and the predetermined voltage level VANTI is lower than the first voltage level Vext.

The switch unit 342 contains an inverter 15 for receiving the power-up signal VEXT_DET and a PMOS transistor MP4 for coupling the predetermined voltage level VANTI to a first node N1. A gate of the PMOS transistor MP4 receives an output of the inverter 15.

The output latch unit 330 has a first inverter 13 and a second inverter 14, which are operated by using the predetermined voltage level VANTI. The first inverter 13 latches a voltage level on the node N1 and outputs an antifuse enable signal ANTI_EN. The second inverter 14 receives and reverses the antifuse enable signal ANTI_EN from the first inverter 13 and outputs a reversed antifuse enable signal.

The program unit 310 includes a NAND gate ND2, a PMOS transistor MP3, a third NMOS transistor MN3 and a fourth NMOS transistor MN4. The NAND gate ND2 receives the program mode selection signal PGM and the address signal ADDR. An output of the NAND gate ND2 is coupled to a gate of the PMOS transistor MP3. The PMOS transistor MP3 is also coupled to an external voltage source of the first voltage level VEXT and a node N1 of the antifuse 320. The output of the NAND gate ND2 is also couple to the third NMOS transistor MN3. The third NMOS transistor MN3 is also coupled to the node N1 of the antifuse 320. Another terminal of the third NMOS transistor MN3 is coupled to the fourth NMOS transistor MN4. A gate of the fourth NMOS transistor MN4 receives the program mode selection signal PGM and the fourth NMOS transistor MN4 connects a ground of the second voltage level Vss and the third NMOS transistor MN3.

Figure 7:
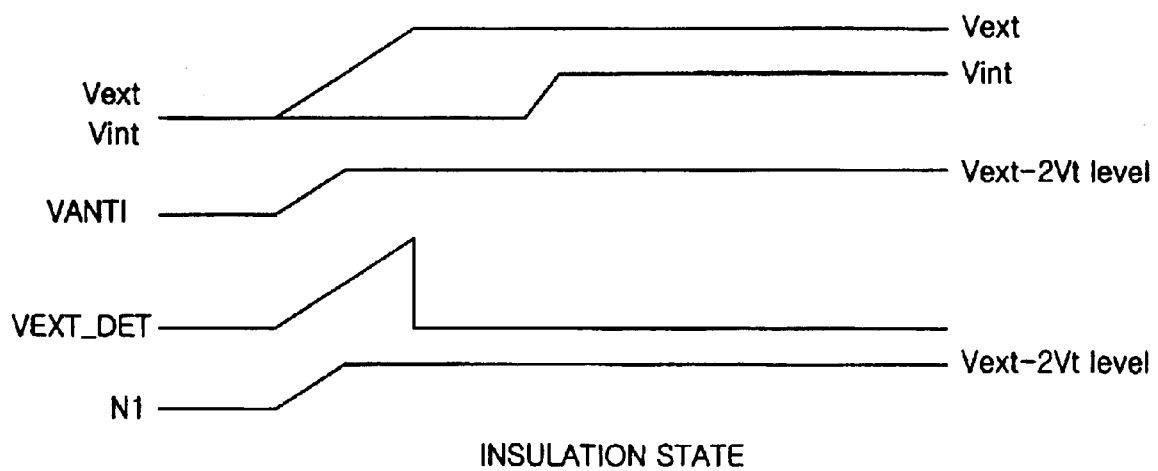
FIG. 7 is a timing diagram for explaining operation of antifuse block described in FIG. 6.

FIG. 7 is a timing diagram showing operation of antifuse block depicted in FIG. 6.

Referring to FIGS. 6 and 7, the operations of the antifuse block shown in FIG. 6 is explained in detail below.

The first voltage level Vext is applied and the standard voltage generator 341 outputs the predetermined voltage level Vext-2Vt to the second node VANTI. The predetermined voltage level is a 2Vt decreased first voltage level and is used as an operation voltage level of the first and second inverters I3 and I4.

In a meantime, a power-up signal VEXT_DET is generated when the first voltage level is inputted and the PMOS transistor MP4 becomes turned on according to the power-up signal VEXT_DET. As a result, a voltage level of the node N1 is increased to the predetermined voltage level Vext-2Vt. If the power-up signal VEXT_DET becomes a low voltage level, the PMOS transistor MP4 becomes turned off and a voltage of the node N1 is maintained as the predetermined voltage level since the inverters I3 and I4 are operated by the predetermined voltage level Vext-2Vt.

Therefore, the external voltage will be not directly applied to the node N1 of the antifuse and there is no floating state at the node N1 since the output latch unit 330 is also operated by the predetermined voltage level when the first voltage level is supplied.

As mentioned above, the disclosed antifuse circuits can increase the reliability of semiconductor devices by stably precharging the antifuse without a direct control of the antifuse by using a high voltage level.

While the disclosed circuits have been described with respect to certain preferred embodiments, it will be apparent to those skilled in the art that various changes and modifications may be made without departing from the scope of the invention as defined in the following claims.

What is claimed is:

1. An antifuse circuit for generating an antifuse enable signal for use in repairing a defected memory cell of a semiconductor device, the antifuse circuit comprising:

an antifuse unit comprising an antifuse, wherein the antifuse is controlled as being shorted or insulated according to a repair program;

an antifuse precharge unit for precharging the antifuse by using a predetermined voltage level in response to a power-up signal, wherein the predetermined voltage level is lower than that of an external voltage source; and an output latch unit driven by the predetermined voltage level for latching a antifuse voltage level appearing on the antifuse and generating the antifuse enable signal corresponding to the antifuse voltage level.

2. The antifuse circuit as recited in claim 1, wherein the antifuse precharge unit further comprises:

an input latch unit for outputting a latched signal by latching the power-up signal and blocking the power-up signal according to an initialization signal inputted before a write/read operation of the semiconductor device; and a pull-up unit for selectively coupling the predetermined voltage level to the antifuse according to the power-up signal.

3. The antifuse circuit as recited in claim 2, wherein the input latch unit comprises a first NOR gate and a second NOR gate, wherein the first NOR gate receives the initialization signal and an output of the second NOR gate and the second NOR gate receives the power-up signal and an output of the first NOR gate.

4. The antifuse circuit as recited in claim 3, wherein the pull-up unit comprises a MOS transistor coupling one end of the antifuse and the predetermined voltage level and a gate of the MOS transistor receives an output of the first NOR gate.

5. The antifuse circuit as recited in claim 4, wherein the predetermined voltage level is an internal voltage level used for operating the semiconductor device.

6. The antifuse circuit as recited in claim 4, wherein the antifuse precharge unit comprises a plurality of inverters coupled between the first NOR gate and the gate of MOS transistor.

7. The antifuse circuit as recited in claim 4, the antifuse unit includes a program unit for programming a state of the antifuse in response to a program mode selection signal and an address signal.

8. The antifuse circuit as recited in claim 7, wherein the program unit further comprises:

a NAND gate for receiving the program mode selection signal and the address signal;

a PMOS transistor having a gate coupled to an output of the NAND gate and connecting an external power voltage supplier and the one end of the antifuse;

a first NMOS transistor having a gate coupled to an output of the NAND gate and being coupled to the one end of the antifuse; and a second NMOS transistor coupling the first NMOS transistor and a ground, receiving the program mode selection signal.

9. The antifuse as recited in claim 8, wherein the output latch unit further comprises:
   a first inverter using the predetermined voltage level as an operation voltage level and comprising an input coupled to one end of the antifuse; and
   a second inverter comprising an input coupled to an output of the first inverter and having an output coupled to the one end of the antifuse.

10. An antifuse circuit for generating an antifuse enable signal for use in repairing a defected memory cell in a semiconductor device, the circuit comprising:
   an antifuse unit comprising an antifuse, wherein the antifuse is controlled as a short-circuited state or a an insulation state according to a repair program;
   a program unit for programming one of the short-circuited and the insulation state of the antifuse in response to a program mode selection signal and an address signal;
   an antifuse precharge unit for precharging the antifuse by using a predetermined voltage level in response to a power-up signal, wherein the predetermined voltage level is lower than that of an external voltage source; and
   an output latch unit driven by the predetermined voltage level for latching a antifuse voltage level appearing on the antifuse and generating the antifuse enable signal corresponding to the antifuse voltage level.

11. The antifuse circuit as recited in claim 10, wherein the antifuse precharge unit further comprises:
   a predetermined voltage level generator for decreasing the voltage level of the external voltage source and outputting the predetermined voltage level; and
   a switch unit for selectively coupling an output of the standard voltage generator to the antifuse in response to the power-up signal.

12. The antifuse circuit as recited in claim 10, wherein the predetermined voltage level generator further comprises:
   a plurality of first MOS transistors coupled to the external voltage source, wherein the plurality of first MOS transistors comprise diodes coupled each other; and
   a second MOS transistor comprising a gate coupled to the external voltage source and being coupled to between the first MOS transistor and a ground.

13. The antifuse circuit as recited in claim 12, wherein the second MOS transistor is constructed with longer channel than the first MOS transistor.

14. The antifuse circuit as recited in claim 12, wherein the switch unit receives the power-up signal and comprises a third MOS transistor coupling the one end of the antifuse and the output of the predetermined voltage level generator.

15. The antifuse circuit as recited in claim 10, wherein the output latch unit further comprises:
   a first inverter using the predetermined voltage level as an operation voltage level and comprising an input coupled to one end of the antifuse; and
   a second inverter comprising an input coupled to an output of the first inverter and an output coupled to the one end of the antifuse.

16. The antifuse circuit as recited in claim 10, wherein the program unit further comprises:
   a NAND gate for receiving the program mode selection signal and the address signal;
   a PMOS transistor having a gate coupled to an output of the NAND gate and connecting an external power voltage supplier and the one end of the antifuse;
   a first NMOS transistor comprising a gate coupled to an output of the NAND gate and to the one end of the antifuse; and
   a second NMOS transistor coupling the first NMOS transistor to a ground, the second NMOS transistor receiving the program mode selection signal.

\* \* \* \* \*